(12) United States Patent
Park

(10) Patent No.: US 7,599,230 B2
(45) Date of Patent: Oct. 6, 2009

(54) SEMICONDUCTOR MEMORY APPARATUS AND METHOD OF DRIVING THE SAME

(75) Inventor: Mun-Phil Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 154 days.

(21) Appl. No.: 11/647,367

(22) Filed: Dec. 29, 2006

(65) Prior Publication Data

US 2007/0285961 A1    Dec. 13, 2007

(30) Foreign Application Priority Data

May 19, 2006    (KR) ...................... 10-2006-0044892

(51) Int. Cl.
*G11C 7/00*    (2006.01)

(52) U.S. Cl. ........................... 365/189.09; 365/185.24; 365/230.03; 365/210.12; 365/104; 365/204

(58) Field of Classification Search ............ 365/189.09, 365/185.24, 230.03, 210.12, 104, 204
See application file for complete search history.

(56) References Cited

U.S. PATENT DOCUMENTS

| | | | |
|---|---|---|---|
| 6,061,267 A * | 5/2000 | Houston | ...................... 365/154 |
| 6,487,124 B2 | 11/2002 | Semi | |
| 6,791,361 B2 | 9/2004 | Alon et al. | |
| 6,839,280 B1 | 1/2005 | Chindalore et al. | |
| 6,864,708 B2 | 3/2005 | Takahaski et al. | |
| 2002/0018366 A1* | 2/2002 | von Schwerin et al. | 365/185.18 |
| 2003/0067318 A1* | 4/2003 | Takahashi et al. | ............ 324/765 |
| 2005/0068059 A1 | 3/2005 | Takahashi et al. | |
| 2006/0006479 A1* | 1/2006 | Kapoor | ...................... 257/393 |
| 2006/0038605 A1* | 2/2006 | Pineda De Gyvez et al. | 327/534 |

FOREIGN PATENT DOCUMENTS

| | | |
|---|---|---|
| JP | 02-003161 | 1/1990 |
| JP | 2000-124418 | 4/2000 |
| JP | 2001-168338 | 6/2001 |
| JP | 2003037494 | 2/2003 |
| JP | 2006-004974 | 1/2006 |
| KR | 10-1998-0004940 | 3/1998 |

OTHER PUBLICATIONS

Office Action dated Feb. 6, 2009 for Taiwan Patent Application No. 95148007.

* cited by examiner

*Primary Examiner*—Thong Q Le
(74) *Attorney, Agent, or Firm*—Venable LLP; Jeffri A. Kaminski

(57) ABSTRACT

A semiconductor memory apparatus includes: a cell region having a plurality of unit cells each of which has a switching MOS transistor for transferring data. A peripheral circuit unit accesses data stored in the unit cell. A threshold voltage control unit controls the threshold voltage of the switching MOS transistor.

38 Claims, 9 Drawing Sheets

SEMICONDUCTOR MEMORY APPARATUS AND METHOD OF DRIVING THE SAME

CROSS-REFERENCE TO RELATED APPLICATIONS

This U.S. non-provisional patent application claims priority under 35 U.S.C.§119 of Korean Patent Application No. 2006-044892 filed on May 19, 2006, the entire contents of which are hereby incorporated by reference.

BACKGROUND OF THE INVENTION

1. Technical Field

The present invention relates to a semiconductor memory apparatus, and in particular to a semiconductor memory apparatus which transfers cell data to bit-lines without loss.

2. Related Art

As semiconductor technology has developed, semiconductor memory apparatuses that can store a large volume of data have been created. A semiconductor memory apparatus stores one data in one cell. In order to store a large amount of data, a plurality of cells should be integrated in one semiconductor memory apparatus. Therefore, cell size is reduced as much as possible with the current the technology such that a plurality of cells can be integrated in the semiconductor memory apparatus. In the case of DRAM, in which a cell may be configured by one transistor and one capacitor, the size of the cell transistor serving as a switch is reduced as much as possible and the capacitance of the cell capacitor is also reduced.

Therefore, since the size of a data signal stored in the cell is very small, the data cannot be directly output from the cell. As a result, an operation to sense and amplify the data stored in the cell is needed. Most semiconductor memory apparatuses have a sense amplifier which senses and amplifies the data stored in the cell. Importantly, it takes a long time to sense and amplify the data. When data stored in a cell is supplied to a bit line, the sense amplifier senses and amplifies a signal difference between a bit line bar that is precharged to a predetermined voltage level and a bit line.

On the other hand, in order to reduce the power consumption of the semiconductor memory apparatus, a level of an external source voltage input to the semiconductor memory apparatus is reduced. Therefore, the level of a driving voltage for driving a sense amplifier is reduced, when causes an increase in the time for sensing and amplifying a voltage difference between a bit line to which a data signal is supplied and a precharged bit line bar by the sense amplifier.

Since the level of the external source voltage is reduced, it is difficult to transfer data stored in a unit cell to a bit line. For example, it is difficult to turn-on or turn-off a switching MOS transistor for transferring the data stored in the unit cell to the bit line, or transferring the data signal supplied to the bit line to the unit cell. The gate of the switching MOS transistor in a unit cell is coupled with a word-line. When an insufficient voltage is applied to the word-line, the MOS transistor which functions as the switch for the unit cell cannot be turned on in sufficient time.

When data reading, writing and reading operations are continuously performed, if the level of a word-line driving voltage generated from the external source voltage is temporarily lowered, the switching MOS transistor in a unit cell cannot be turned on. This means a data signal cannot be transferred to the bit line, data can not be sensed and amplified, and as a result data access fails.

SUMMARY OF THE INVENTION

Embodiments of the present invention provide a semiconductor memory apparatus having a switching MOS transistor in a unit cell that can be smoothly turned on/off, even with a low level external source voltage.

An embodiment of the present invention provides a semiconductor memory apparatus including: a cell region having a plurality of unit cells each of which has a switching MOS transistor for transferring data; a peripheral circuit unit for accessing data stored in the unit cell; and a threshold voltage control unit that controls the threshold voltage of the switching MOS transistor.

Another embodiment of the present invention provides a semiconductor memory apparatus including: a switching MOS transistor that constitutes a unit cell arranged in a cell region; a bank bulk voltage supply unit that supplies a bulk voltage to a bulk of the MOS transistor; and a peripheral circuit bulk voltage supply unit that supplies the bulk voltage to a peripheral circuit, wherein the bank bulk voltage supply unit temporarily supplies a first bulk voltage to the switching MOS transistor when accessing data so as to decrease the threshold voltage of the switching MOS transistor.

Still another embodiment of the present invention provides a semiconductor memory apparatus including: a switching MOS transistor that constitutes a unit cell arranged in a cell region; a bulk voltage supply unit that selectively supplies a first bulk voltage or a second bulk voltage to the bulk of the MOS transistor; and a command control unit that controls the bulk voltage supply unit, wherein the bulk voltage supply unit temporarily supplies the first bulk voltage to the switching MOS transistor when accessing data so as to decrease the threshold voltage of the switching MOS transistor.

Yet another embodiment of the present invention provides a semiconductor memory apparatus including: a switching MOS transistor that constitutes a unit cell arranged in a cell region; a bulk voltage supply unit that supplies a first bulk voltage to a bulk of the MOS transistor; a switch circuit unit coupled with an output terminal of the bulk voltage supply unit that switches the output terminal to a second bulk voltage terminal; and a command control unit that controls the switch circuit unit, wherein the output terminal of the bulk voltage supply unit is temporarily switched by the switch circuit unit when accessing data so as to decrease the threshold voltage of the switching MOS transistor.

A further embodiment of the present invention provides a method of driving a semiconductor memory apparatus including: supplying a first bulk voltage having a first voltage level as a bulk voltage of a switching MOS transistor; supplying the first bulk voltage having a second voltage level as the bulk voltage of the switching MOS transistor; transferring a data signal stored in a unit cell to a bit line by turning on the switching MOS transistor; and supplying the first bulk voltage as the bulk voltage of the switching MOS transistor.

DESCRIPTION OF EXEMPLARY EMBODIMENT

Hereinafter, the present invention now will be described more fully hereinafter with reference to the accompanying drawings, in which preferred embodiments of the invention are shown.

Figure 1:
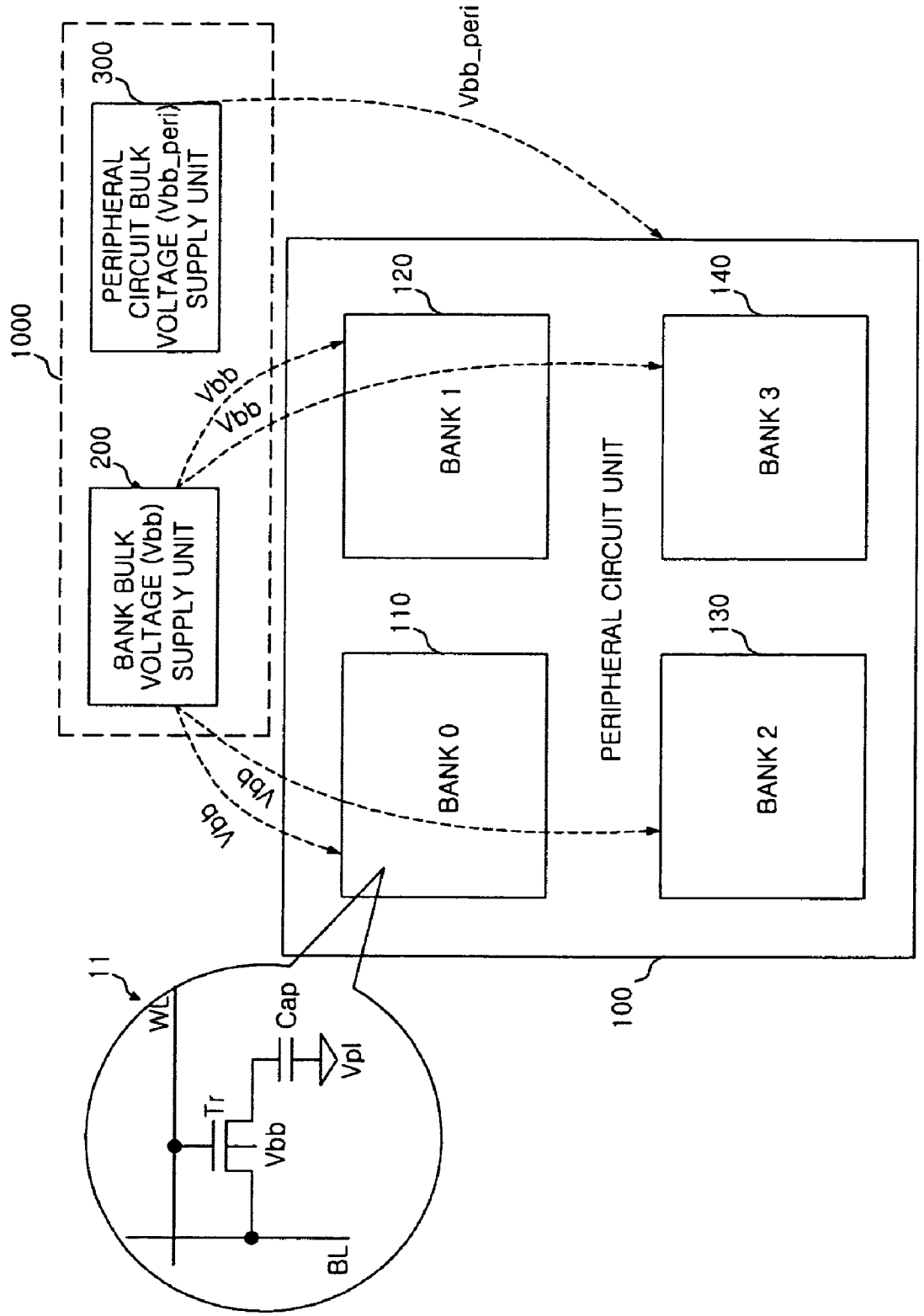
FIG. 1 is a block diagram of a semiconductor memory apparatus according to an embodiment of the present invention.

Referring to FIG. 1, a semiconductor memory apparatus includes a plurality of cell regions 110, 120, 130, and 140 having a plurality of unit cells 11, each of which has a switching MOS transistor for transferring data; a peripheral circuit unit 100 for accessing data stored in the unit cells 11 disposed in the cell regions; and a threshold voltage control unit 1000 that controls the threshold voltage of the switching MOS transistors. The cell regions are, for example, divided into four banks, that is, bank 0 to bank 3, 110, 120, 130, and 140. The unit cell 11 may have a switching MOS transistor Tr and a capacitor Cap for storing data. The gate of the switching MOS transistor Tr is coupled with a word-line WL, the drain terminal (or the source terminal) of the MOS transistor Tr is coupled with a bit line BL, and the source terminal (or the drain terminal) of the MOS transistor Tr is coupled with one end of the capacitor Cap (a storage node). The other end of the capacitor Cap (a plate node) is coupled with a cell plate voltage Vpl supply terminal.

The threshold voltage control unit 1000 supplies a bulk voltage to a bulk terminal bb of the switching MOS transistor. The threshold voltage control unit 1000 temporarily lowers the level of the bulk voltage so as to temporarily lower the threshold voltage of the switching MOS transistor Tr. A period during which the bulk voltage level is temporarily decreased may be the period in which data signal is transferred by the switching MOS transistor Tr. Further, the period when the level of the bulk voltage is temporarily decreased preferably includes a period to sense and amplify data transferred by the switching MOS transistor Tr.

The threshold voltage control unit 1000 includes a bank bulk voltage supply unit 200 that generates and supplies a bulk voltage Vbb to the switching MOS transistor Tr arranged in the cell regions 110, 120, 130, and 140; and a peripheral circuit bulk voltage supply unit 300 that generates a peripheral circuit bulk voltage Vbb_Peri to be transferred to a MOS transistor (not shown) arranged in the peripheral circuit 100. The threshold voltage control unit 1000 may be disposed in a desired region on-chip.

Figure 2:
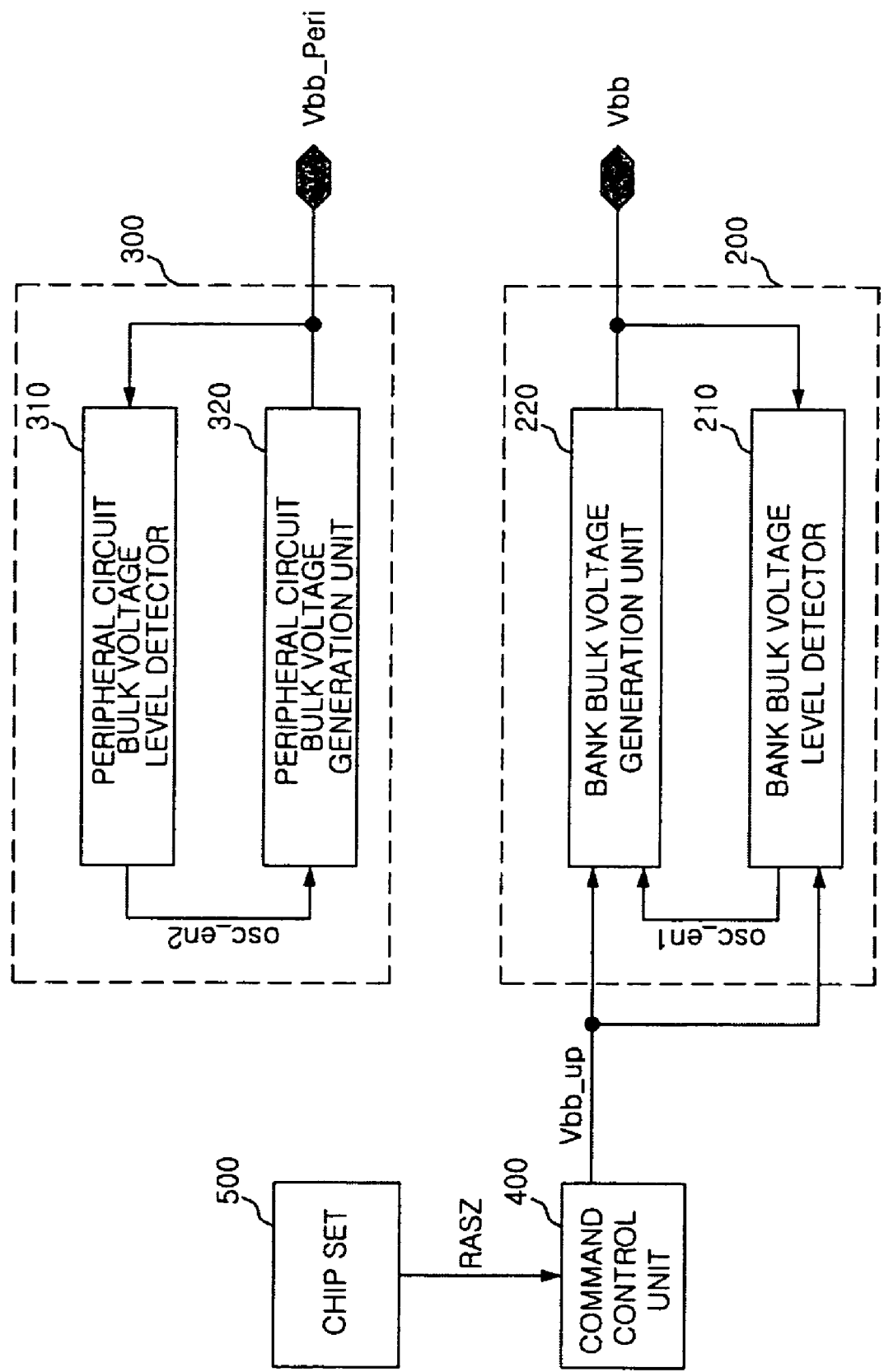
FIG. 2 is a detailed block diagram of the bank bulk voltage supply unit and the peripheral circuit bulk voltage supply unit shown in FIG. 1.

Referring to FIG. 2, the bank bulk voltage supply unit 200 includes: a bank bulk voltage generation unit 220 for generating the bank bulk voltage Vbb; and a bank bulk voltage level detector 210 that detects the level of the bank bulk voltage Vbb and controls the output of the bank-bulk voltage generation unit 220. The output of the bank-bulk voltage may be the bank bulk voltage Vbb having a predetermined level.

Further, the semiconductor memory apparatus according to the embodiment of the present invention further includes a command control unit 400 for outputting a control signal Vbb_up. The control signal Vbb_up controls the output of the bulk voltage generation unit 220 so that the bulk voltage generation unit 220 outputs the bank bulk voltage Vbb in response to an active signal RASZ input from a chip set 500.

Further, the peripheral circuit bulk voltage supply unit 300 includes: a peripheral circuit bulk voltage generation unit 320 that supplies bulk voltage Vbb_Peri for the peripheral circuit; and, a peripheral, circuit bulk voltage level detector 310 that detects the level of the bulk voltage for the peripheral circuit Vbb_Peri and controls the output of the peripheral circuit bulk voltage generation unit 320. The output of the peripheral circuit bulk voltage generation unit 320 may be bulk voltage for the peripheral circuit Vbb_Peri having a predetermined value. The peripheral circuit bulk voltage supply unit 300 is not controlled by the control signal Vbb_up so as to supply peripheral circuit bulk voltage Vbb_Peri to be separated from the bank bulk voltage Vbb.

Figure 3:
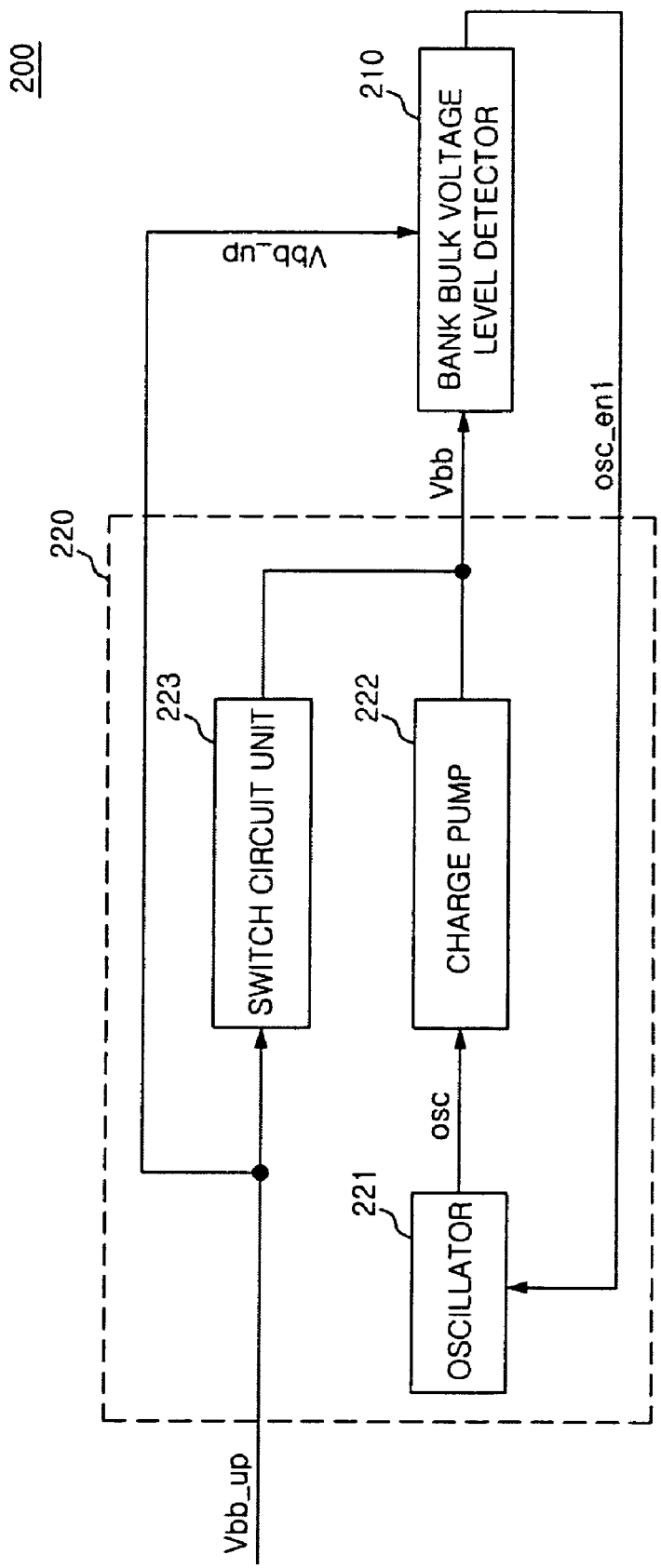
FIG. 3 is a detailed block diagram of the bank-bulk voltage supply unit shown in FIG. 2.

FIG. 3 is a detailed block diagram of the bank bulk voltage supply unit shown in FIG. 2.

Referring to FIG. 3, the bank-bulk voltage generation unit 220 includes: an oscillator 221 that supplies an oscillated clock signal OSC in response to an oscillation detecting signal osc_en1 supplied from the bank bulk voltage level detector 210; a charge pump 222 that pumps electrical charges from an output terminal of the oscillator 221 in response to the oscillated clock signal OSC such that the bank bulk voltage Vbb can become a predetermined voltage level; and a switch circuit unit 223 that controls the level of the bank-bulk voltage Vbb, supplied to the cell regions through an output terminal of the charge pump 222 in response to the control signal Vbb_up, so Vbb is maintained at the same level as the level of a ground voltage during the period when the level of the bank bulk voltage Vbb is temporarily decreased. Here, the oscillator 221 is preferably a ring oscillator.

Figure 4:
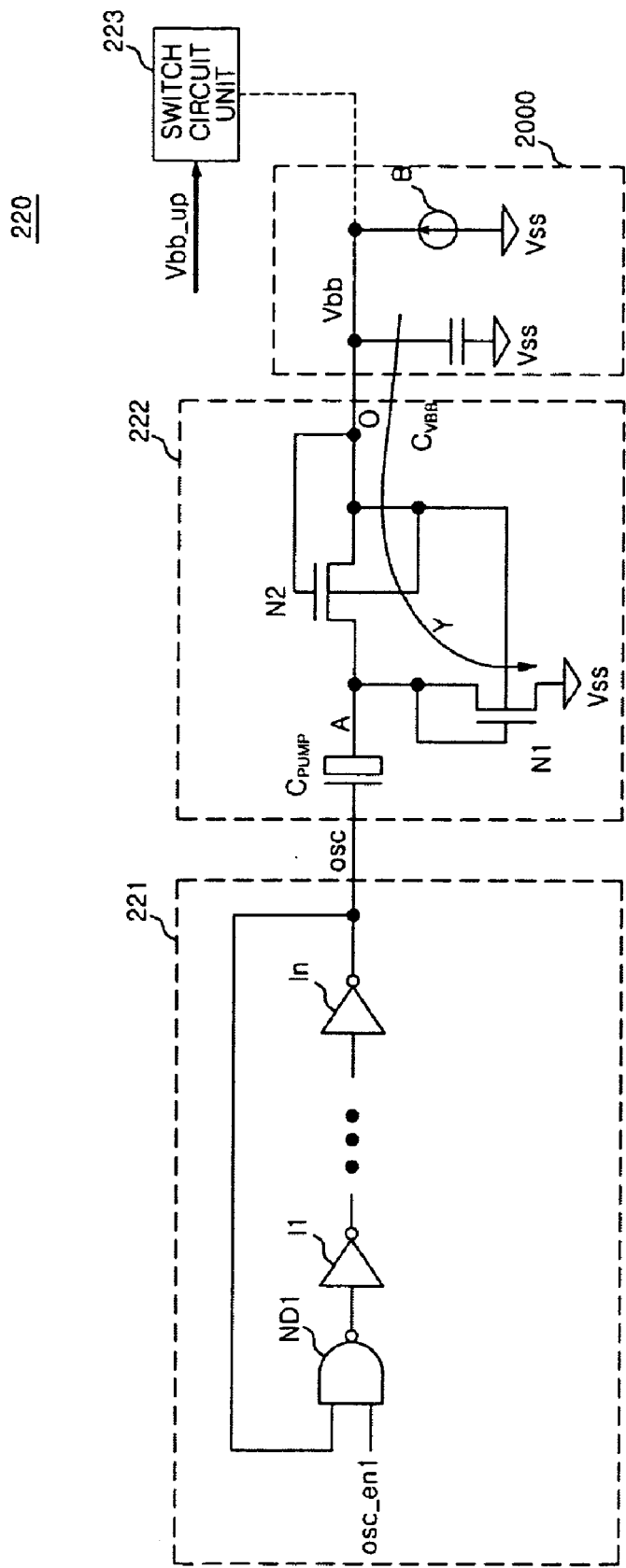
FIG. 4 is a circuit diagram of the bank bulk voltage generation unit shown in FIG. 3.

FIG. 4 is a circuit diagram of the internal structure of each block of the bank bulk voltage supply unit 220 shown in FIG. 3.

Referring to FIG. 4, the oscillator 221 includes a NAND gate ND1 having one terminal which receives the oscillation sensing signal osc_en1; and a plurality of inverters I1 to In that are arranged in series to each other, receive an output signal of the NAND gate ND1, and output a final output signal to the other terminal of the NAND gate ND1.

The charge pump 222 includes: a capacitor Cpump, one terminal of which receives the oscillated clock signal OSC; a first diode N1 that is provided between a second terminal of the capacitor Cpump and a ground terminal as a pull-down element; and a second diode N2 that is provided between the second terminal of the capacitor Cpump and the output terminal as a switch. It is preferable that the first and second diodes N1 and N2 be implemented using an NMOS transistor. A load unit 2000 is shown as an equivalent circuit to represent a load generated by the cell region to which the bank bulk voltage Vbb is supplied.

Figure 5:
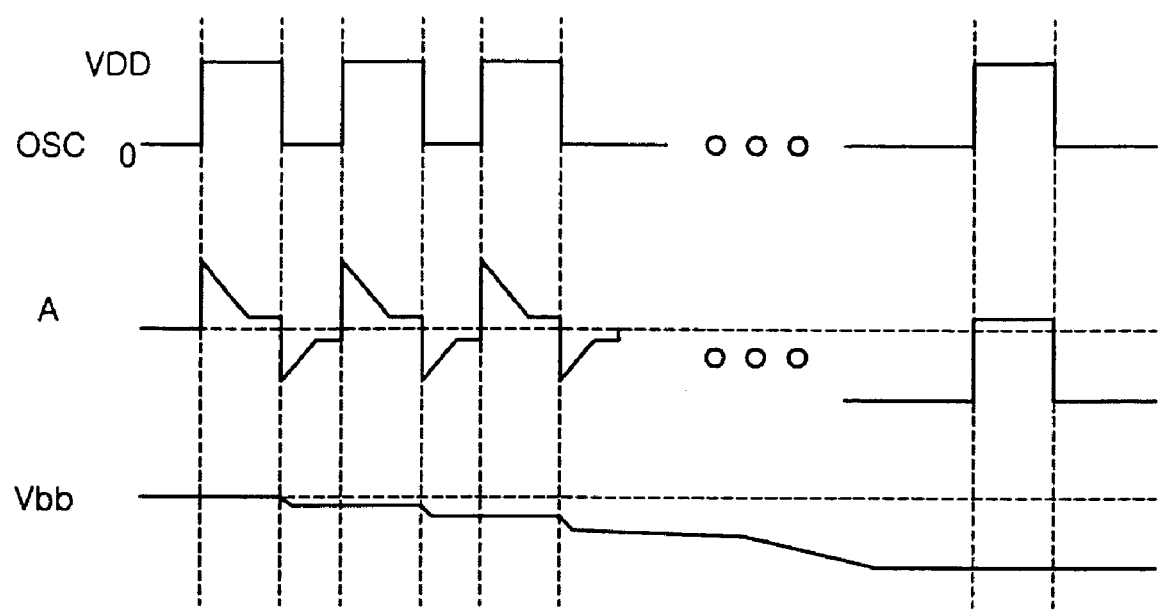
FIG. 5 is a waveform showing an operation of the bank bulk voltage supply unit shown in FIG. 4.

FIG. 5 is a timing diagram showing the operation of the bank-bulk voltage supply unit shown in FIG. 4.

Referring to FIG. 5, when the oscillated clock signal OSC is supplied to the charge pump 222 from the oscillator 221, the charge pump 222 increases and then decreases the voltage level of a node A in response to the oscillated clock signal OSC such that the bank bulk voltage Vbb output through the output terminal O is maintained at a predetermined voltage level.

Figure 6:
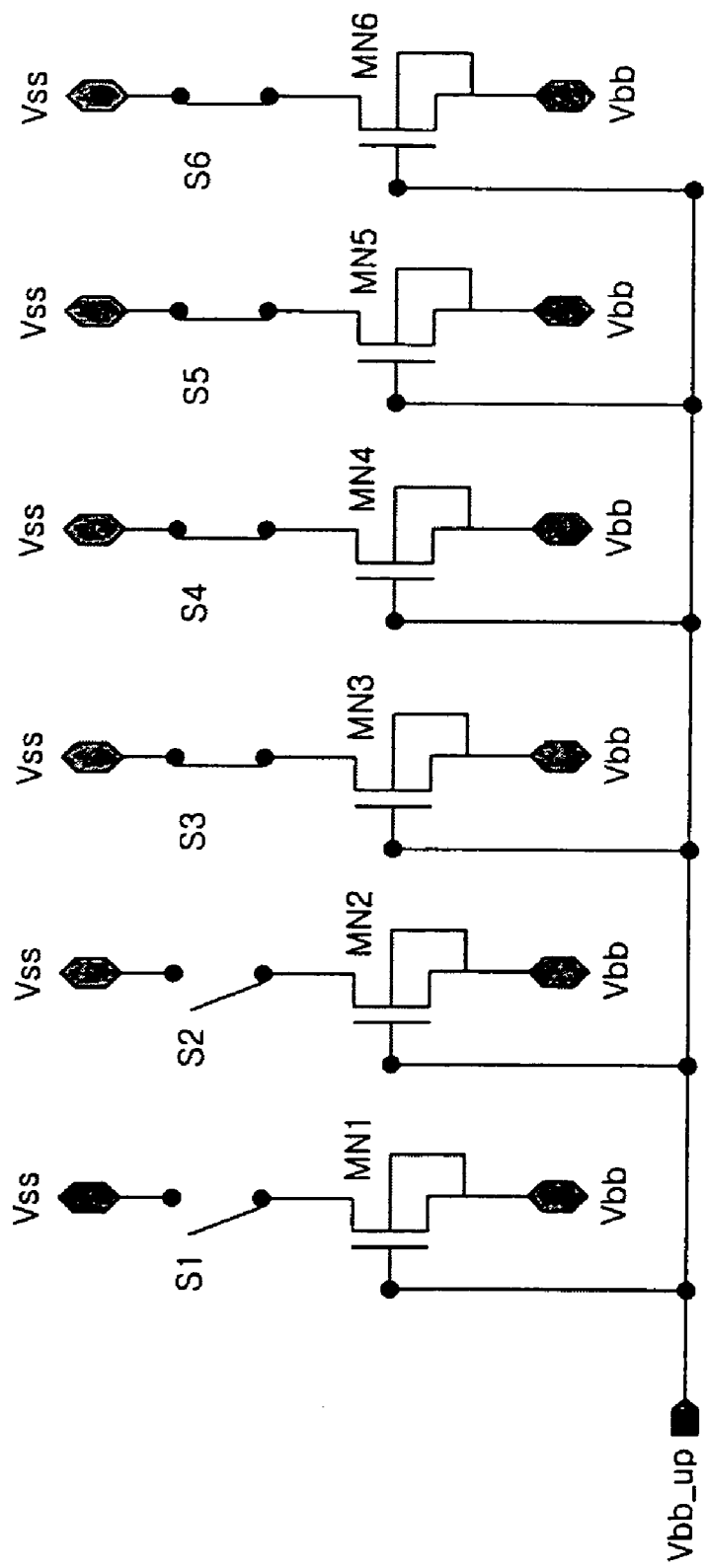
FIG. 6 is a circuit diagram of the switch circuit unit shown in FIG. 3.

FIG. 6 is a circuit diagram of an example of the switch circuit unit 223 shown in FIG. 3.

Referring to FIG. 6, a switch circuit unit 223 includes a plurality of MOS transistors MN1 to MN6, that are arranged in parallel to each other, one terminal of which is coupled with the output terminal O of the charge pump 222, that is, a supply terminal for the bank-bulk voltage Vbb, and the gates of which receive the control signal Vbb_up; and a plurality of switches S1 to S6 that are arranged in parallel to each other so as to correspond to the plurality of MOS transistors MN1 to MN6 that switch the other terminal of each of the plurality of MOS transistors MN1 to MN6 and a ground voltage Vss supply terminal. Here, the plurality of switches S1 to S6 can be implemented by, for example, either metal wiring, a logical circuit, or the MOS transistor.

When the control signal Vbb up is enabled, the switch circuit unit 223 turns on the MOS transistors MN1 to MN6 so as to temporarily increase the level of the bank bulk voltage Vbb output through the output terminal of the charge pump to the level of the ground voltage Vss.

The switches S1 to S6 coupled with the other terminal of each of the MOS transistors MN1 to MN6 are arranged so as to determine the time when the level of the bank bulk voltage Vbb output from the charge pump is increased to the level of the ground voltage Vss. The number of switches S1 to S6 to be coupled is determined on the basis of the operational characteristics of the semiconductor memory apparatus or by considering the time when the level of the bank bulk voltage Vbb is increased to the level of the ground voltage Vss.

Figure 7:
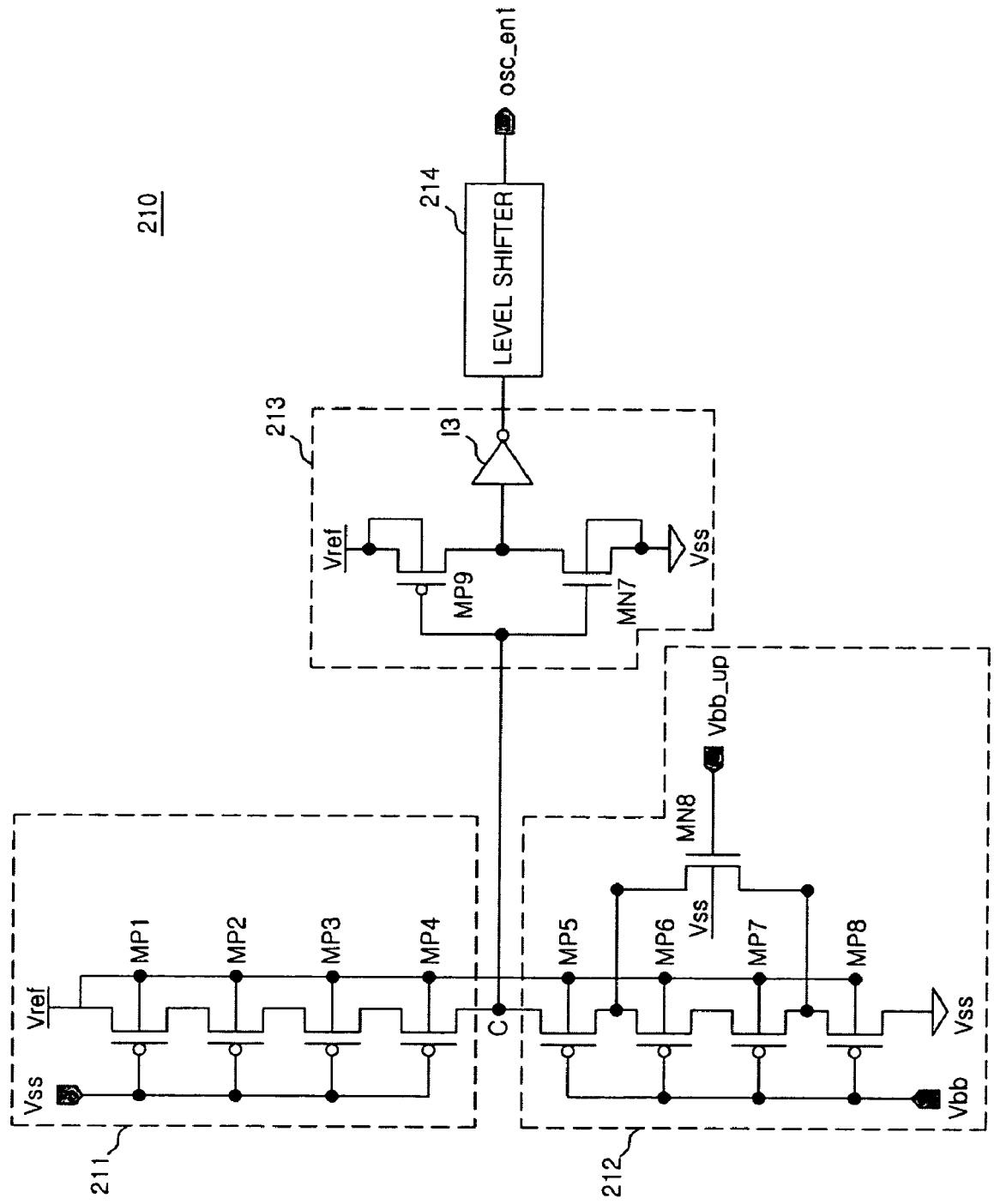
FIG. 7 is a circuit diagram of the bank bulk voltage level detector shown in FIG. 2.

FIG. 7 is a circuit diagram of the bank bulk voltage level detector shown in FIG. 2.

Referring to FIG. 7, the bank bulk voltage level detector 210 includes: a first level detection unit 211 that transfers a reference voltage Vref to a first node C corresponding to the voltage level of a ground voltage supply terminal; a second level detection unit 212 that transfers the ground voltage Vss to the first node C corresponding to the level of the bank bulk voltage Vbb; a buffer unit 213 that buffers the voltage of the first node C on the basis of a voltage difference variation of the level of the reference voltage Vref and the level of the ground voltage Vss; and a level-shifter 214 that shifts the voltage of the buffer unit 213 to a predetermined level so as to output the oscillation detecting signal osc_en1. The first level detection unit 211 includes a plurality of PMOS transistors MP1, MP2, MP3, and MP4, each of which is coupled in series between the terminal of the reference voltage Vref and the first node C as a resistor. Each gate of the plurality of PMOS transistors MP1, MP2, MP3, and MP4 is coupled with the ground terminal Vss. The second level detection unit 212 includes a plurality of PMOS transistors MP5, MP6, MP7, and MP8, each of which is coupled in series between the ground terminal Vss, and the first node C as a resistor, and a bypass transistor MN8. Each gate of the plurality of PMOS transistors MP5, MP6, MP7, and MP8 is coupled with the supply terminal of the bank bulk voltage Vbb and the control signal Vbb_up is supplied to the gate of the bypass transistor MN8.

The structure of the peripheral circuit bulk voltage supply unit 300 shown in FIG. 2 may be implemented similarly to the detailed circuit structure of the above-described bank bulk voltage supply unit 200. For example, the peripheral circuit bulk voltage level detector 310 may have the same circuit structure as the bank bulk voltage level detector 210 shown in FIG. 7. The peripheral circuit bulk voltage generation unit 320 may have a circuit structure in which the switch circuit unit 223 is removed from the bank bulk voltage generation unit 220 shown in FIG. 4.

Figure 8:
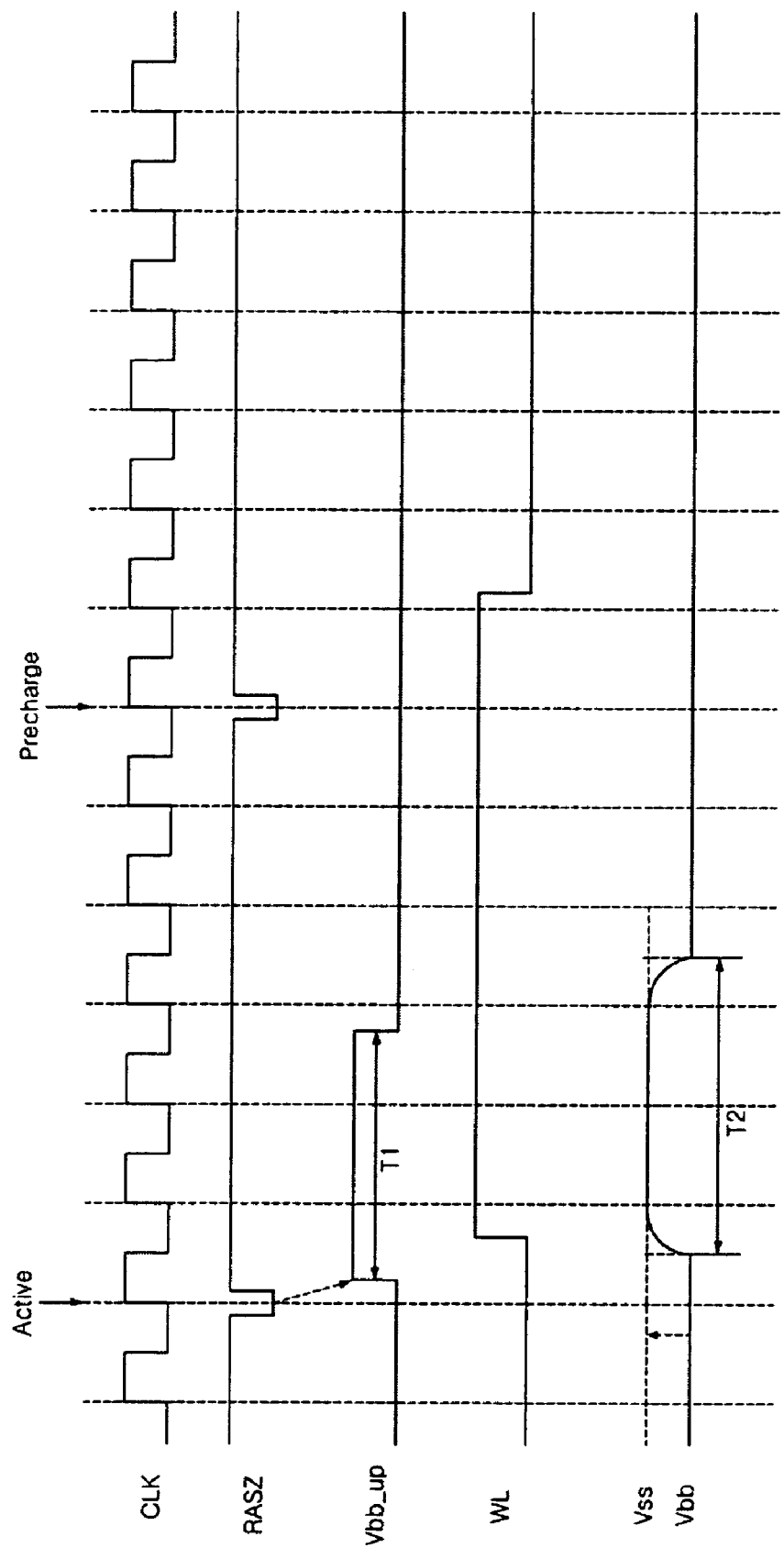
FIG. 8 is a timing diagram of the semiconductor memory apparatus shown in FIGS. 1 and 2.

FIG. 8 is an operational timing diagram of the semiconductor memory apparatus shown in FIGS. 1 and 2 according to an embodiment of the present invention.

Figure 9:
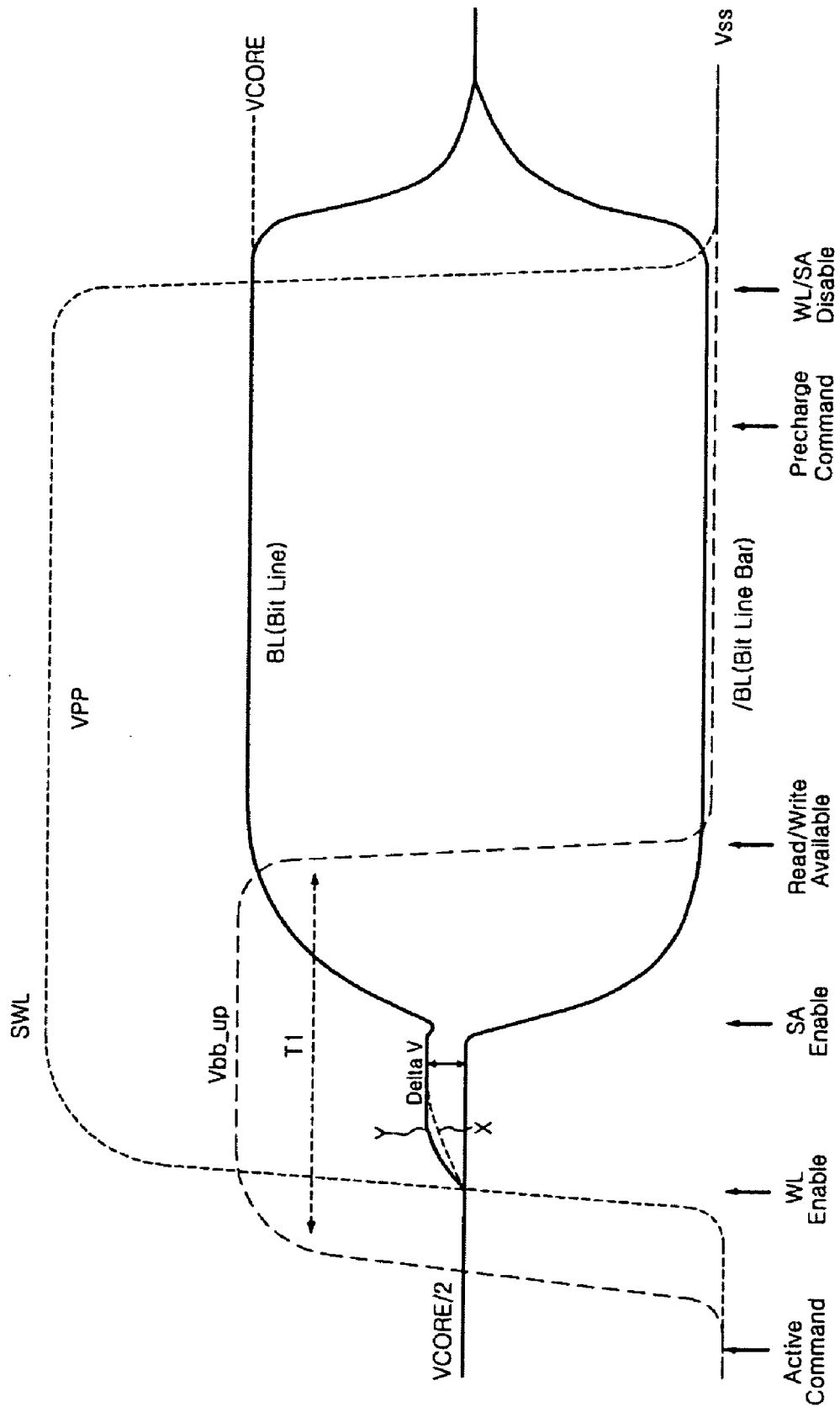
FIG. 9 is a waveform showing the operation of the semiconductor memory apparatus shown in FIGS. 1 and 2.

FIG. 9 is a waveform showing an operation of the semiconductor memory apparatus shown in FIGS. 1 and 2.

Hereinafter, the operation of the semiconductor memory apparatus according to the embodiment of the present invention will be described in detail with reference to FIGS. 8 and 9.

The semiconductor memory apparatus according to an embodiment of the present invention has the following characteristics.

When a driving voltage such as an external source voltage or an elevated voltage Vpp is temporarily decreased, the threshold voltage of a cell transistor in a bank is temporarily decreased so that data in a unit cell can be easily transferred to a bit line. A first bulk voltage at a first voltage level is supplied as a bulk voltage to the switching MOS transistor (Tr of FIG. 1) of the unit cell, and the first bulk voltage having a second voltage level higher than the first voltage level is supplied as a bulk voltage to the switching MOS transistor Tr. Then, the data signal stored in the unit cell is transferred to the bit line by turning on the switching MOS transistor Tr. Thereafter, the first bulk voltage is supplied as the bulk voltage of the MOS transistor such that the threshold voltage of the switching MOS transistor returns to the original threshold voltage.

Here, an absolute value of the first voltage level is larger than an absolute value of the second voltage level, as an absolute value of the bulk voltage is large in a cell MOS transistor, the threshold voltage becomes large. Therefore, it is preferable that a step of sensing and amplifying the data signal transferred to the bit line is added. Further, it is more preferable to perform the step of sensing and amplifying the data signal when the first bulk voltage having the second voltage level is provided as the bulk voltage of the switching MOS transistor Tr.

In particular, referring to FIG. 2, the control signal Vbb_up is generated and output from the command control unit 400 at the same time as when the active command RASZ is applied to the DRAM from the chip set. Thereafter, the bank bulk voltage supply unit 200 receives the control signal Vbb_up and the bank bulk voltage generation unit 220 raises the level of the bank bulk voltage Vbb to the level of the ground voltage Vss.

Therefore, the threshold voltage of the cell transistor arranged in the bank is lowered for a predetermined period so that the turn-on resistance decreases. Accordingly, it becomes easy to transfer data to the bit line and a bit line sense amplifier can precisely sense and amplify signals applied to the bit line.

The bank bulk voltage level detector 210 raises the level detected in response to the control signal Vbb_up to the level of the ground voltage Vss, higher than a predetermined negative level, such that the level of the bank bulk voltage Vbb does not become a negative level.

During a period when the bank bulk voltage generation unit 220 increases the level of the bank bulk voltage Vbb to the level of the ground voltage Vss, the data signal transferred to the bit line may be sensed and amplified, and the data signal stored in the unit cell transferred to the bit line by turning on the switching MOS transistor Tr. Therefore, an optimized time may be determined by considering these two steps.

Further, in the embodiment of the present invention, as shown in FIG. 2, the bank bulk voltage generation unit 220 is separate from the peripheral circuit bulk voltage generation unit 320. Meanwhile, the bank bulk voltage generation unit 220 and the peripheral circuit bulk voltage generation unit 320 can be combined. For example, the level detectors 210 and 310 or the bank voltage generation units 220 and 320 can be selectively and commonly used. Further, the bulk voltage supply units 200 and 300 can be commonly used. During the period when the bank bulk voltage generation unit 220 raises the level of the output bank bulk voltage Vbb to the level of the ground voltage Vss, the level of the threshold voltage of the MOS transistor arranged in the peripheral circuit unit 100 becomes a high level.

As shown in FIG. 8, when the active command RASZ is input and the control signal Vbb_up is activated to a high level in response to the input active command RASZ, the level of the bank bulk voltage Vbb increases to a predetermined level, for example, to a level of the ground voltage Vss, during a predetermined period. At this time, the word-line is activated to a high level during the predetermined period according to the active command RASZ.

FIG. 9 shows the operation of the semiconductor memory apparatus shown in FIG. 8 in detail. First, if an active command Active Command is applied and an address corresponding to the active command is input, a word-line is selected and activated to an elevated voltage VPP level(WL Enable). Also a control signal Vbb_up for increasing the bank bulk voltage Vbb is activated in response to the active command Active Command for a predetermined period. Thus the bank bulk voltage Vbb which is higher than the predetermined negative voltage is provided to the bulk terminal of the cell transistor arranged in the bank by the control signal Vbb-up.

Thereafter, a bit line is selected according to an address corresponding to the active command Active Command and the sense amplifier in the selected bit line senses and amplifies the voltage of a pair of the bit lines, that is BL(Bit Line) and /BL(Bit Line Bar) from a half core voltage Vcore/2 level to a core voltage Vcore level and a ground voltage Vss level.

Since the bank bulk voltage Vbb having the raised level is supplied to a bulk terminal of the cell transistor, the threshold voltage of the cell transistor is decreased and the data stored in the cell is easily transferred to the bit line. Therefore, the sense amplifier can smoothly sense and amplify the data signal applied to the BL(Bit Line) and /BL(Bit Line Bar).

As shown in FIG. 9, a line Y sensed according to an embodiment of the present invention has a larger margin than a line X sensed according to the related art. The margin is a delta voltage Delta V, which is a voltage level difference between a pair of bit lines.

After the sense amplifier completes the sensing and amplifying operation, a read operation or write operation is performed(Read/Write Available). Thereafter, a precharge operation is performed according to a precharge command Precharge Command. As described above, the semiconductor memory apparatus according to an embodiment of the present invention controls the bank bulk voltage Vbb applied to the bulk terminal of the cell transistor so as to change the threshold voltage of the cell transistor and easily transfer the cell data to the bit line. Therefore, the voltage difference Delta V between a pair of bit lines is easily acquired such that the sense amplifier can smoothly perform the sensing and amplifying operation.

For stable operational characteristics, the semiconductor memory apparatus supplies a bulk voltage at a negative voltage level to a bulk terminal of a cell transistor, to prevent data stored in the cell from being lost, by preventing a PN junction included in the MOS transistor from having a forward bias. Therefore, a latch-up which may occur due to the structure of the MOS transistor can be prevented. If the bulk voltage supplied to the bulk terminal of the cell transistor is changed as in an embodiment of the present invention, the threshold voltage of the cell transistor may change. The more the level of the bulk voltage is lowered, the more the threshold voltage of the MOS transistor is raised. On the other hand, the more the level of the bulk voltage is raised, the more the threshold voltage of the MOS transistor is lowered.

According to the related art, when the semiconductor memory apparatus is activated, if an internal driving voltage, in particular, a driving voltage level for turning on the cell transistor (for example, an elevated voltage VPP which is an enable voltage of the word-line) is temporarily decreased during the operation (it is extremely lowered when performing a continuous refresh operation or continuous access), the voltage level to be applied to the gate of the cell transistor cannot sufficiently reach 'threshold+α voltage'. Therefore, the cell transistor cannot be sufficiently turned on and the data stored in the cell cannot be transferred to the bit line.

Meanwhile, in the semiconductor memory apparatus according to an embodiment of the present invention, when the semiconductor memory apparatus is activated, since the bulk voltage is increased to the level of the ground voltage during a predetermined period, the threshold voltage of the cell transistor can be decreased and the cell transistor can be sufficiently turned on. Therefore, the data stored in the cell can be applied to the bit line without loss.

Especially, when the refresh operation or a write-refresh-pause(stop operation)-read operation is continuously performed, a drop in the level of the turn-on voltage of the cell transistor can be compensated for by decreasing the threshold voltage of the cell transistor. Therefore, the turn-on operation of the cell transistor can be more effectively performed.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

As described above, according to an embodiments of the present invention, by the operations of a semiconductor memory apparatus which is operated at a low voltage are continuously performed, when the level of an internal driving voltage, for example, the level of a word-line-driving voltage, is temporarily decreased, the threshold voltage of a cell transistor is adjusted according to the decreased level of the internal driving voltage, that is, the decreased driving voltage is compensated for. Therefore, data can be stably accessed.

What is claimed is:

1. A semiconductor memory apparatus comprising:
   a cell region having a plurality of unit cells each of which has a transistor for transferring data, the transistor having a threshold voltage;
   a peripheral circuit unit for accessing data stored in the unit cell; and
   a threshold voltage control unit coupled with the transistor and that controls the threshold voltage of the transistor, wherein the threshold voltage control unit comprises:
   a bank bulk voltage supply unit configured to generate and supply the bulk voltage to the transistor arranged in the cell region; and
   a peripheral circuit bulk voltage supply unit configured to generate and supply a peripheral circuit bulk voltage to a transistor arranged in the peripheral circuit.

2. The semiconductor memory apparatus of claim 1, wherein the transistor arranged in the cell region includes a bulk terminal and the threshold voltage control unit supplies the bulk voltage to the bulk terminal of the transistor.

3. The semiconductor memory apparatus of claim 2, wherein the threshold voltage control unit temporarily decreases a level of the bank bulk voltage so as to temporarily decrease the threshold voltage of the transistor for transferring data.

4. The semiconductor memory apparatus of claim 3, wherein a period during which the bank bulk voltage level is temporarily decreased is the period in which a data signal is transferred by the transistor.

5. The semiconductor memory apparatus of claim 4, wherein the period when the level of the bank bulk voltage is temporarily decreased further comprises a previously determined period for sensing and amplifying the data signal transferred by the transistor.

6. The semiconductor memory apparatus of claim 1, wherein the cell region comprises a plurality of banks.

7. The semiconductor memory apparatus of claim 6, wherein the bank bulk voltage supply unit comprises:
a bank bulk voltage generation unit configured to supply the bank voltage; and
a bank bulk voltage level detector configured to detect the level of the bank bulk voltage and control the bank bulk voltage generation unit such that the bank bulk voltage is at a predetermined level.

8. The semiconductor memory apparatus of claim 7 further comprising:
a command control unit configured to output a control signal to control the bank bulk voltage generation unit so the bank bulk voltage is output in response to an active signal input from a chip set.

9. The semiconductor memory apparatus of claim 7, wherein the bank bulk voltage generation unit comprises:
an oscillator configured to supply an oscillated clock signal in response to an oscillation detecting signal supplied from the bank bulk voltage level detector;
a charge pump configured to pump electrical charges of an output terminal in response to the oscillated clock signal such that the bank bulk voltage can become a predetermined voltage level; and
a switch circuit unit configured to control the level of the bank bulk voltage to be supplied to the cell regions through the output terminal of the charge pump in response to the control signal to become the level of a ground voltage during the period when the level of the bank bulk voltage is temporarily decreased.

10. The semiconductor memory apparatus of claim 9, wherein the oscillator is a ring oscillator.

11. The semiconductor memory apparatus of claim 10, wherein the oscillator comprises:
a NAND gate having a first terminal to receive the oscillation detecting signal, a second terminal and configured to produce an output signal; and
a plurality of inverters coupled in series with each other, and configured to receive the output signal of the NAND gate, and to output an output signal to the second terminal of the NAND gate.

12. The semiconductor memory apparatus of claim 9, wherein the charge pump comprises:
a capacitor having a first terminal and a second terminal, the first terminal to receive the oscillated clock signal;
a first diode coupled between the second terminal of the capacitor and a ground terminal; and
a second diode coupled between the second terminal of the capacitor and the output terminal.

13. The semiconductor memory apparatus of claim 12, wherein the first and second diodes comprise MOS transistors.

14. The semiconductor memory apparatus of claim 9, wherein the switch circuit unit comprises:
a plurality of MOS transistors arranged in parallel to each other, having one terminal coupled with the output terminal, and gates to receive the control signal; and
a plurality of switches each of which is coupled to a respective one of the plurality of MOS transistors and to a ground voltage supply terminal.

15. The semiconductor memory apparatus of claim 14, wherein the plurality of switches comprise MOS transistors.

16. The semiconductor memory apparatus of claim 7, wherein the bank bulk voltage level detector comprises:
a first level detection unit configured to transfer a reference voltage to a first node based on the voltage level of a ground voltage supply terminal;
a second level detection unit configured to transfer the ground voltage to the first node based on the level of the bank bulk voltage;
a buffer unit configured to buffer the voltage of the first node on the basis of a voltage variation of the level of the reference voltage and the level of the ground voltage; and
a level-shifter configured to shift the voltage of the buffer unit to a predetermined level so as to output the oscillation detecting signal.

17. The semiconductor memory apparatus of claim 1, wherein the peripheral circuit bulk voltage supply unit comprises:
a peripheral circuit bulk voltage generation unit configured to supply the peripheral circuit bulk voltage; and
a peripheral circuit bulk voltage level detector configured to detect a level of the peripheral circuit bulk voltage and control the bank bulk voltage generation unit such that the peripheral circuit bulk voltage is at a predetermined level.

18. A semiconductor memory apparatus comprising:
a transistor having a bulk and a threshold voltage that forms a unit cell arranged in a cell region;
a bank bulk voltage supply unit configured to supply a bank bulk voltage to a bulk of the transistor; and
a peripheral circuit bulk voltage supply unit configured to supply a peripheral circuit bulk voltage to a peripheral circuit,
wherein the bank bulk voltage supply unit temporarily supplies a first bulk voltage as the bank bulk voltage to the transistor when accessing data so as to decrease the threshold voltage of the transistor.

19. The semiconductor memory apparatus of claim 18, wherein a period during which the bank bulk voltage supply unit temporarily supplies the first bulk voltage is the period in which a data signal is transferred by the transistor.

20. The semiconductor memory apparatus of claim 19, wherein the period during which the bank bulk voltage supply unit temporarily supplies the first bulk voltage further comprises a previously determined period for sensing and amplifying the data signal transferred by the transistor.

21. The semiconductor memory apparatus of claim 18, wherein the level of the first bulk voltage is a level of a ground voltage.

22. The semiconductor memory apparatus of claim 21, wherein the bank bulk voltage supply unit supplies a second bulk voltage at a negative voltage level as the bank bulk voltage in a period other than the period in which the first bulk voltage is supplied.

23. The semiconductor memory apparatus of claim 18, wherein the bank bulk voltage supply unit comprises:
a bank bulk voltage generation unit configured to supply the bulk voltage; and
a bank bulk voltage level detector configured to detect the level of the bank bulk voltage and control the bank bulk voltage generation unit such that the bulk voltage is at a predetermined level.

24. The semiconductor memory apparatus of claim 23,
wherein the bank bulk voltage supply unit further comprises a command control unit configured to output a control signal to control the bulk voltage generation unit so the bank bulk voltage is output in response to an active signal input from a chip set.

25. The semiconductor memory apparatus of claim 23,
wherein the bank bulk voltage generation unit comprises:
an oscillator configured to supply an oscillated clock signal in response to an oscillation detecting signal supplied from the bank bulk voltage level detector;
a charge pump configured to pump electrical charges of an output terminal in response to the oscillated clock signal such that the bulk voltage can become a predetermined voltage level; and
a switch circuit unit configured to control the level of the bulk voltage to be supplied to the cell regions through the output terminal of the charge pump in response to the control signal to become a level of a ground voltage during the period when the bank bulk voltage supply unit temporarily supplies the first bulk voltage.

26. The semiconductor memory apparatus of claim 18,
wherein the peripheral circuit bulk voltage supply unit includes:
a peripheral circuit bulk voltage generation unit configured to supply the peripheral circuit bulk voltage; and
a peripheral circuit bulk voltage level detector configured to detect a level of the peripheral circuit bulk voltage and control the peripheral circuit bulk voltage generation unit such that the peripheral circuit bulk voltage is at a predetermined level.

27. A semiconductor memory apparatus comprising:
a transistor that forms a unit cell arranged in a cell region;
a bulk voltage supply unit configured to selectively supply a first bulk voltage or a second bulk voltage to the bulk of the MOS transistor; and
a command control unit configured to control the bulk voltage supply unit,
wherein the bulk voltage supply unit temporarily supplies the first bulk voltage to the transistor when accessing data so as to decrease the threshold voltage of the transistor, wherein the bulk voltage supply unit comprises:
a bulk voltage generation unit configured to supply the first or second bulk voltage; and
a bulk voltage level detector configured to detect the level of the first or second bulk voltage and control the bulk voltage generation unit such that the bulk voltage is at a predetermined level.

28. The semiconductor memory apparatus of claim 27,
wherein a period during which a first bulk voltage level is temporarily decreased is the period in which data signal is transferred by the transistor.

29. The semiconductor memory apparatus of claim 28,
wherein the period when the level of the bulk voltage is temporarily decreased further comprises a previously determined period for sensing and amplifying data transferred by the transistor.

30. The semiconductor memory apparatus of claim 27,
wherein the level of the first bulk voltage is a level of a ground voltage.

31. The semiconductor memory apparatus of claim 30,
wherein the bulk voltage supply unit supplies a second bulk voltage at a negative voltage level in a period other than the period in which the first bulk voltage is supplied.

32. The semiconductor memory apparatus of claim 27,
wherein the bulk voltage level detector supplies an oscillation detecting signal
wherein the bulk voltage generation unit comprises:
an oscillator configured to supply an oscillated clock signal in response to the oscillation detecting signal supplied from the bulk voltage level detector;
a charge pump configured to pump electrical charges of an output terminal in response to the oscillated clock signal such that the bulk voltage can become a predetermined voltage level; and
a switch circuit unit configured to control a level of the bulk voltage to be supplied to the cell regions to become a level of a ground voltage during the period when the level of the bulk voltage is temporarily decreased.

33. A semiconductor memory apparatus comprising:
a transistor that forms a unit cell arranged in a cell region;
a bulk voltage supply unit configured to supply a first bulk voltage to a bulk of the MOS transistor and having an output terminal;
a switch circuit unit coupled with the output terminal of the bulk voltage supply unit and configured to switch the output terminal to a second bulk voltage terminal; and
a command control unit configured to controls the switch circuit unit,
wherein the output terminal of the bulk voltage supply unit is temporarily switched by the switch circuit unit when accessing data so as to decrease the threshold voltage of the transistors, wherein the bulk voltage supply unit comprises:
a bulk voltage generation unit configured to supply the first bulk voltage; and
a bulk voltage level detector configured to detect the level of the first or second bulk voltage and control the output of the bulk voltage generation unit such that the bulk voltage is at a predetermined level.

34. The semiconductor memory apparatus of claim 33,
wherein a period during which the output terminal is temporarily switched is the period in which data signal is transferred by the transistor.

35. The semiconductor memory apparatus of claim 34,
wherein the period that is temporarily switched further comprises a previously determined period for sensing and amplifying the data signal transferred by the transistor.

36. The semiconductor memory apparatus of claim 33,
wherein a level of the second bulk voltage is a level of the ground voltage.

37. The semiconductor memory apparatus of claim 36,
wherein the bulk voltage supply unit supplies a first bulk voltage at a negative voltage level in a period other than the period in which the second bulk voltage is supplied.

38. The semiconductor memory apparatus of claim 33,
wherein from the bulk voltage level supplies an oscillation detecting signal supplies,
wherein the bulk voltage generation unit comprises:
an oscillator configured to supply the oscillated clock signal in response to an oscillation detecting signal supplied from the bulk voltage level detector; and
a charge pump configured to pump electrical charges of an output terminal in response to the oscillated clock signal such that the bulk voltage can become a predetermined voltage level.

* * * * *